US009983371B2

(12) United States Patent
Ghandour et al.

(10) Patent No.: US 9,983,371 B2
(45) Date of Patent: May 29, 2018

(54) OPTOELECTRONIC TRANSDUCER WITH INTEGRALLY MOUNTED THERMOELECTRIC COOLER

(71) Applicant: MELLANOX TECHNOLOGIES, LTD., Yokneam (IL)

(72) Inventors: Morees Ghandour, Rama Village (IL); Elad Mentovich, Tel Aviv (IL); Itshak Kalifa, Ramat Gan (IL); Sylvie Rockman, Zichron Yaakov (IL); Dalit Kimhi, Ramat Hasharon (IL); Alon Webman, Tel Aviv (IL)

(73) Assignee: Mellanox Technologies, Ltd., Yokneam (IL)

( * ) Notice: Subject to any disclaimer, the term of this patent is extended or adjusted under 35 U.S.C. 154(b) by 267 days.

(21) Appl. No.: 15/064,108

(22) Filed: Mar. 8, 2016

(65) Prior Publication Data
US 2017/0261712 A1    Sep. 14, 2017

(51) Int. Cl.
| | |
|---|---|
| G02B 6/42 | (2006.01) |
| G01J 1/02 | (2006.01) |
| G01J 1/04 | (2006.01) |
| H01S 5/024 | (2006.01) |
| H01S 5/183 | (2006.01) |

(52) U.S. Cl.
CPC .......... *G02B 6/4271* (2013.01); *G01J 1/0252* (2013.01); *G01J 1/0425* (2013.01); *H01S 5/02415* (2013.01); *H01S 5/183* (2013.01)

(58) Field of Classification Search
CPC ... G02B 6/4271; H01S 5/02415; H01S 5/183; G01J 1/0252; G01J 1/0425
USPC ..................................... 250/227.11
See application file for complete search history.

(56) References Cited

U.S. PATENT DOCUMENTS

| | | | |
|---|---|---|---|
| 2007/0196104 A1* | 8/2007 | Nelson ................... | H04B 10/40 398/25 |
| 2009/0028574 A1* | 1/2009 | Dybsetter ............... | G06F 11/27 398/135 |

* cited by examiner

*Primary Examiner* — Seung C Sohn
(74) *Attorney, Agent, or Firm* — Alston & Bird LLP

(57) ABSTRACT

An apparatus and method of assembly are described that provide improved mechanisms for cooling an optoelectronic transducer in a fiber optic system. The apparatus includes a thermoelectric cooler (TEC) secured to the optoelectronic transducer for removing heat from the optoelectronic transducer in response to instructions from a TEC driver, as well as a microcontroller electrically connected to the TEC driver for monitoring temperature and communicating with the TEC driver to selectively activate and deactivate the TEC at least partially based on the monitored temperature and/or other measured/detected data to effect a more efficient cooling mechanism for optoelectronic transducers, such as VCSELs. In addition, the user may be able to configure the system to maintain the optoelectronic transducer within a user-defined range of temperatures. In this way, a longer life and better performance of the optoelectronic transducer may be achieved, and datacenter costs related to cooling and/or maintenance may be minimized.

20 Claims, 7 Drawing Sheets

OPTOELECTRONIC TRANSDUCER WITH INTEGRALLY MOUNTED THERMOELECTRIC COOLER

BACKGROUND

The present disclosure relates in general to optoelectronic interfaces for transmitting optical signals through fiber optic cable systems. In particular, apparatuses and methods of assembling optoelectronic interfaces are described that provide active cooling of optoelectronic transducers using an integrally mounted thermoelectric cooler.

As technology progresses and datacenters for the transmission of optical signals over fiber optic networks become more advanced, the use of vertical-cavity surface-emitting lasers (VCSELs) in optoelectronic transducers for the emission of light through fiber optic cables has increased. VCSELs are often required to operate under high bandwidth conditions, and the performance of the VCSEL is frequently dependent on the temperature of the VCSEL and its environment.

BRIEF SUMMARY

Embodiments of the invention described herein therefore provide improved optoelectronic interfaces and components thereof, as well as improved methods of assembling optoelectronic interfaces, that provide active cooling of the optoelectronic transducer (e.g., the VCSEL) to promote optimal operation of the optoelectronic transducer and minimize failure of the optoelectronic transducer before its end of life is reached. Moreover, embodiments of the apparatuses and methods described herein allow for user configuration of the temperature ranges for the operation of the optoelectronic transducer, such that the transducer is maintained in the desired range of temperatures according to the user's needs and preferences.

Accordingly, in some embodiments, an apparatus is provided that comprises a printed circuit board assembly and an optoelectronic transducer supported on the printed circuit board assembly and configured to convert between optical signals and corresponding electrical signals for respectively transmitting or receiving optical signals through a fiber optic cable. The apparatus further includes a thermoelectric cooler secured to the optoelectronic transducer and configured to remove heat from the optoelectronic transducer, and a thermoelectric cooler driver supported on the printed circuit board assembly and comprising driving circuitry configured to activate and deactivate the thermoelectric cooler. The apparatus also includes a microcontroller configured to monitor a temperature of the printed circuit board assembly and to communicate with the thermoelectric cooler driver to selectively activate and deactivate the thermoelectric cooler at least partially based on the monitored temperature so as to regulate a temperature of the optoelectronic transducer.

In some embodiments, the optoelectronic transducer comprises a vertical-cavity surface-emitting laser (VCSEL). Additionally or alternatively, the optoelectronic transducer may comprise a photodetector (PD). The optoelectronic transducer may comprise a VCSEL and a PD, and the thermoelectric cooler may be secured to at least one of a planar surface of the VCSEL or a planar surface of the PD. In some cases, the thermoelectric cooler may be directly secured to the optoelectronic transducer via epoxy.

The microcontroller may be configurable by a user to selectively activate and deactivate the thermoelectric cooler to maintain the optoelectronic transducer within a user-defined range of temperatures. The apparatus may, in some embodiments, comprise a thermal sensor, and the microcontroller may be configured to communicate with the thermal sensor to monitor the temperature of the printed circuit board assembly.

In some cases, the apparatus may further comprise an optoelectronic transducer driver supported on the printed circuit board assembly, and the optoelectronic transducer driver may comprise driving circuitry configured to control operation of the optoelectronic transducer. The optoelectronic transducer driver may be configured to detect a current of the optoelectronic transducer. The microcontroller may be further configured to determine a temperature of the optoelectronic transducer based on the current detected by the optoelectronic transducer driver, and the microcontroller may be configured to selectively activate and deactivate the thermoelectric cooler at least partially based on the temperature of the optoelectronic transducer. In some cases, the thermoelectric cooler driver may be configured to receive a voltage drop detected across the thermoelectric cooler and to communicate the detected voltage drop to the microcontroller, and the microcontroller may be configured to communicate with the thermoelectric cooler driver to selectively activate and deactivate the thermoelectric cooler at least partially based on the voltage drop.

In still other embodiments, a method of assembling an optoelectronic interface is provided that comprises mounting an optoelectronic transducer onto a printed circuit board assembly and securing a thermoelectric cooler to the optoelectronic transducer. The optoelectronic transducer may be configured to convert between optical signals and corresponding electrical signals for respectively transmitting or receiving optical signals through a fiber optic cable, and the thermoelectric cooler may be configured to remove heat from the optoelectronic transducer. A thermoelectric cooler driver may be mounted to the printed circuit board assembly, and the thermoelectric cooler driver may be connected to the thermoelectric cooler. The thermoelectric cooler driver may comprise driving circuitry configured to activate and deactivate the thermoelectric cooler. The method may further include mounting a microcontroller to the printed circuit board assembly and connecting the microcontroller to the thermoelectric cooler driver. The microcontroller may be configured to monitor a temperature of the printed circuit board assembly and to communicate with the thermoelectric cooler driver to selectively activate and deactivate the thermoelectric cooler at least partially based on the monitored temperature so as to regulate a temperature of the optoelectronic transducer.

The optoelectronic transducer may comprise a vertical-cavity surface-emitting laser (VCSEL). Additionally or alternatively, the optoelectronic transducer comprises a photodetector (PD). In some cases, the optoelectronic transducer may comprise a VCSEL and a PD, and the method may further comprise securing the thermoelectric cooler to at least one of a planar surface of the VCSEL or a planar surface of the PD. The thermoelectric cooler may be directly secured to the optoelectronic transducer via epoxy.

The microcontroller may be configurable by a user to selectively activate and deactivate the thermoelectric cooler to maintain the optoelectronic transducer within a user-defined range of temperatures. In some embodiments, the method may further comprise mounting a thermal sensor to the printed circuit board assembly and connecting the thermal sensor to the microcontroller, wherein the microcontroller is configured to communicate with the thermal sensor to monitor the temperature of the printed circuit board assembly.

An optoelectronic transducer driver may be mounted to the printed circuit board assembly in some cases, where the optoelectronic transducer driver comprises driving circuitry configured to control operation of the optoelectronic transducer, and where the optoelectronic transducer driver is configured to detect a current of the optoelectronic transducer. The microcontroller may be further configured to determine a temperature of the optoelectronic transducer based on the current detected by the optoelectronic transducer driver, where the microcontroller is configured to selectively activate and deactivate the thermoelectric cooler at least partially based on the temperature of the optoelectronic transducer. The thermoelectric cooler driver may be configured to receive a voltage drop detected across the thermoelectric cooler and to communicate the voltage drop to the microcontroller, where the microcontroller is configured to communicate with the thermoelectric cooler driver to selectively activate and deactivate the thermoelectric cooler at least partially based on the voltage drop.

BRIEF DESCRIPTION OF THE SEVERAL VIEWS OF THE DRAWING(S)

Having thus described the disclosure in general terms, reference will now be made to the accompanying drawings, which are not necessarily drawn to scale, and wherein:

DETAILED DESCRIPTION OF THE DRAWINGS

The present invention now will be described more fully hereinafter with reference to the accompanying drawings in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

As noted above, optoelectronic transducers, particularly VCSELs, are increasingly becoming one of the most critical components of optoelectronic interfaces in fiber optic network datacenters. Because they are often required to operate across large bandwidths, the optoelectronic transducers may be very temperature sensitive. Generally speaking, optoelectronic transducers including VCSELs, for example, are designed to operate at a maximum operating temperature of approximately 60° C.-65° C., and sustained operation at temperatures above this range often cause the optoelectronic transducers to fail prior to reaching their end of life.

Figure 1:
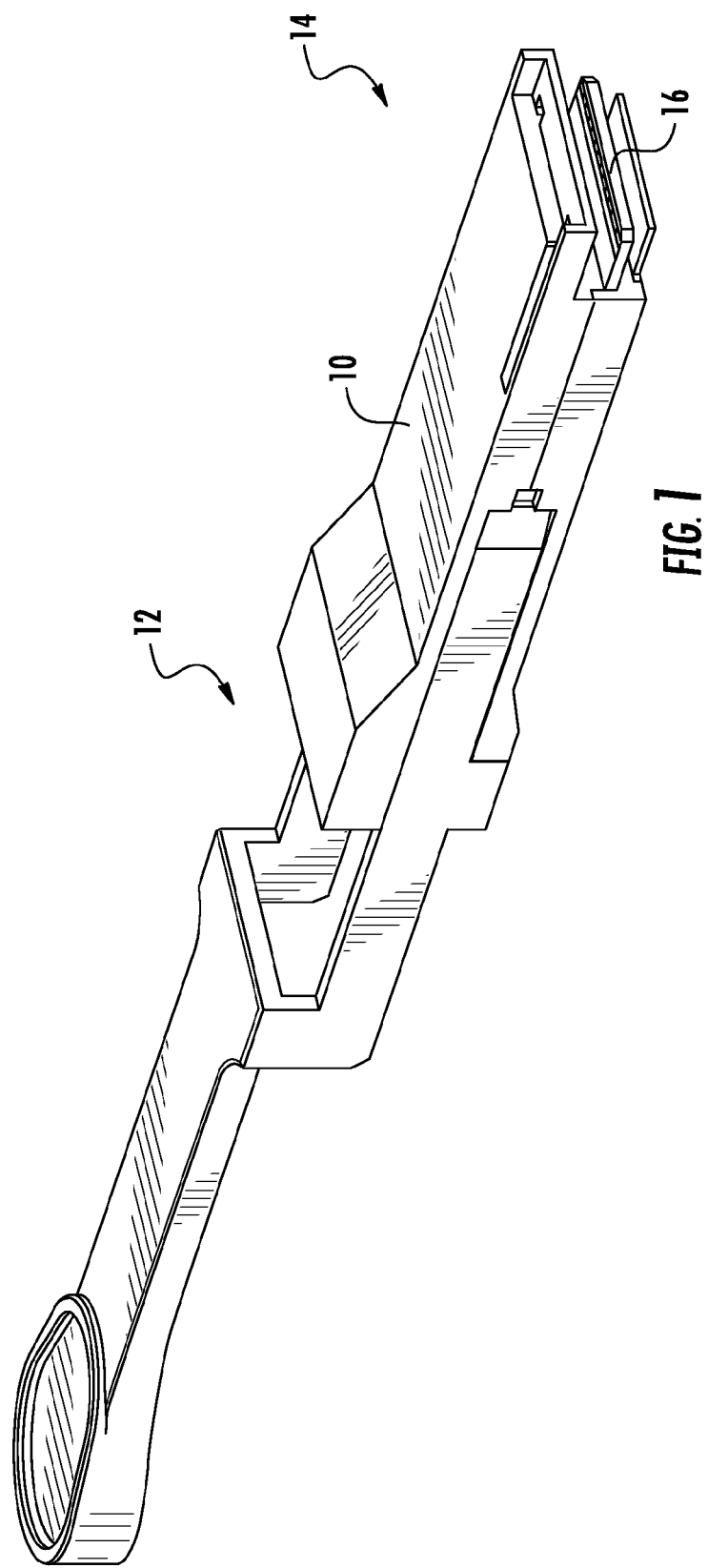
FIG. 1 is a perspective view of a housing for an optoelectronic interface according to an example embodiment.

With reference to FIG. 1, an optoelectronic interface, which includes the optoelectronic transducer as well as other components (not shown for clarity), is typically enclosed in a housing 10. External optical cables (not shown) may be received at one end 12 of the housing 10 of the optoelectronic interface, such as via an optical ferrule holder, and electrical connections may be made at the other end 14 of the housing 10, such as via a printed circuit board (PCB) connector port 16. Multiple optoelectronic interfaces, in their respective housings 10, may in turn be located in switch boxes in the datacenter, typically at the end of a "pizza box" (e.g., a wide, flat case that holds the switches). The configuration of the "pizza box" can compound the effect of heat generation within the housing of the optoelectronic interface, as the hot air generated by the operation of one or more of the components may be driven to the end of the "pizza box" where the optoelectronic transducer is located.

Typically, the driving circuitry for the optoelectronic interface is the main source of heat in the optoelectronic interface. Conventional techniques for cooling the optoelectronic interface have therefore generally focused on decreasing the amount of heat that is generated by the driving circuitry or removing the heat from the driving circuitry and its environment, such that the heat does not reach the optoelectronic transducer in the first place. Conventional cooling strategies have included the use of cooling towers that are in conductive contact with the driving circuitry and/or its environment. Such passive cooling techniques have, in some cases, also involved the use of thermoelectric coolers (TECs) disposed near the optoelectronic transducer (e.g., the VCSEL). In conventional cases, the TEC is not placed in direct contact with the optoelectronic transducer, but rather relies on the use of a thermal conductive layer that contacts a cooling surface of the TEC and a surface of the optoelectronic transducer to conduct heat from the optoelectronic transducer to the TEC, then emit the heat from the TEC, such as via a cooling tower. Examples of such cooling techniques are described in U.S. Pat. No. 9,016,957 titled "Integrated Optical Cooling Core for Optoelectronic Interconnect Modules," which is incorporated by reference herein.

Figure 2:
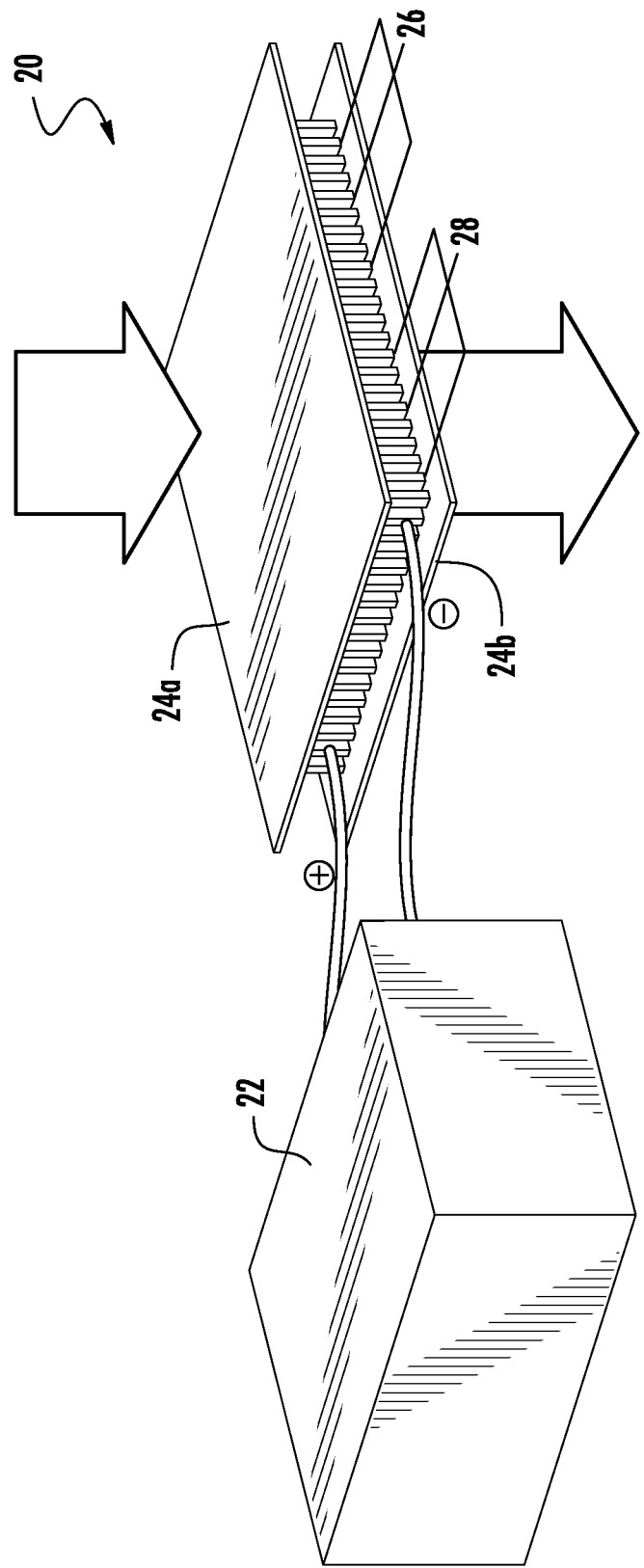
FIG. 2 is a schematic illustration of a thermoelectric cooler (TEC) according to an example embodiment.

A TEC is a solid-state heat pump that uses the Peltier effect to provide cooling. FIG. 2 provides a simplified schematic illustration of a TEC 20. In particular, electric current (e.g., from a direct current (DC) power source 22) is passed through two conductors 24a, 24b (e.g., ceramic substrates). An array of p- and n-type semiconductor elements 26, 28 is provided between the two substrates 24a, 24b, with the elements 26, 28 connected to the substrates electrically in series and thermally in parallel. As the current passes through one or more pairs of elements 26, 28, the temperature of the substrate 24a at the junction of the dissimilar semiconductor elements 26, 28 decreases, creating a heat sink. The heat is carried through the TEC 20 via electron transport and is released at the substrate 24b on the opposite side of the array of elements 26, 28 as the electrons move back from a high-energy state to a low-energy state.

The cost to a datacenter of using a TEC according to conventional techniques is significant due in large part to the continuous operation of the TEC, which in turn requires a constant flow of electric current through the TEC.

Accordingly, embodiments of the present invention described herein provide mechanisms for directly cooling the optoelectronic transducers in an optoelectronic interface by mounting a TEC directly on a surface of the optoelectronic transducer (e.g., on a surface of the VCSEL). Moreover, embodiments of the present invention monitor the temperature of the optoelectronic transducer and/or its environment and selectively activate and deactivate the TEC to cool the optoelectronic transducer when the temperature rises, thereby reducing the cost of operating the TEC while maintaining the optoelectronic transducer within a desired range of temperatures, as described in greater detail below.

Figure 3:
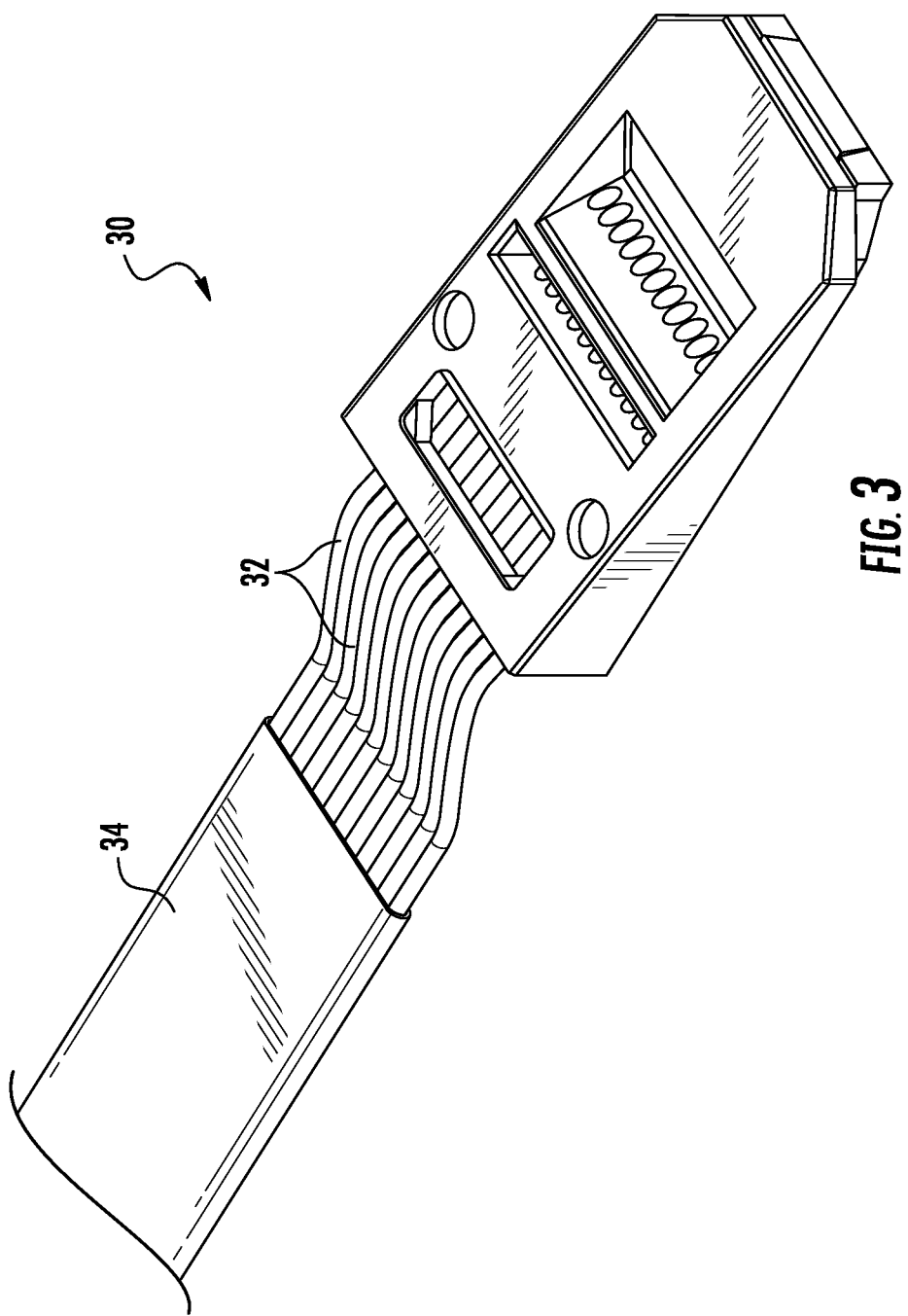
FIG. 3 is a perspective view of an optoelectronic interface according to an example embodiment.

With reference now to FIG. 3, an optoelectronic interface 30 is illustrated, which may be disposed in a housing 10 such as that shown in FIG. 1. The optoelectronic interface 30 may be configured to transmit optical signals via optical fibers 32 of an internal optical cable 34 based on electrical signals received via the PCB connector port 16 shown in FIG. 1. Likewise, the optoelectronic interface 30 may be configured to receive optical signals via the optical fibers 32 of the internal optical cable 34 and transmit corresponding electrical signals via the PCB connector port 16. In this regard, an optoelectronic transducer 40 may be provided that is supported on a printed circuit board (PCB) assembly 42, as shown in the bottom view of the PCB assembly 42 depicted in FIG. 4. The optoelectronic transducer 40 may allow for the interconnection of the optical fibers 32 (FIG. 3) and the PCB connector port 16 (FIG. 2) and may be configured to convert between optical signals and the corresponding electrical signals for respectively transmitting or receiving optical signals through the fiber optic cables 32.

For example, the optoelectronic transducer 40 may include a photodetector (PD) and/or a VCSEL. The PD may be configured to detect light for converting the optical signals received via the optical fibers 32 into electrical signals for transmission via the PCB connector port 16. The VCSEL may be configured to convert electrical signals received via the PCB connector port 16 into optical signals for transmission via the optical fibers 32. The PD and the VCSEL may be connected to the PCB assembly 42 via respective dies.

Figure 4:
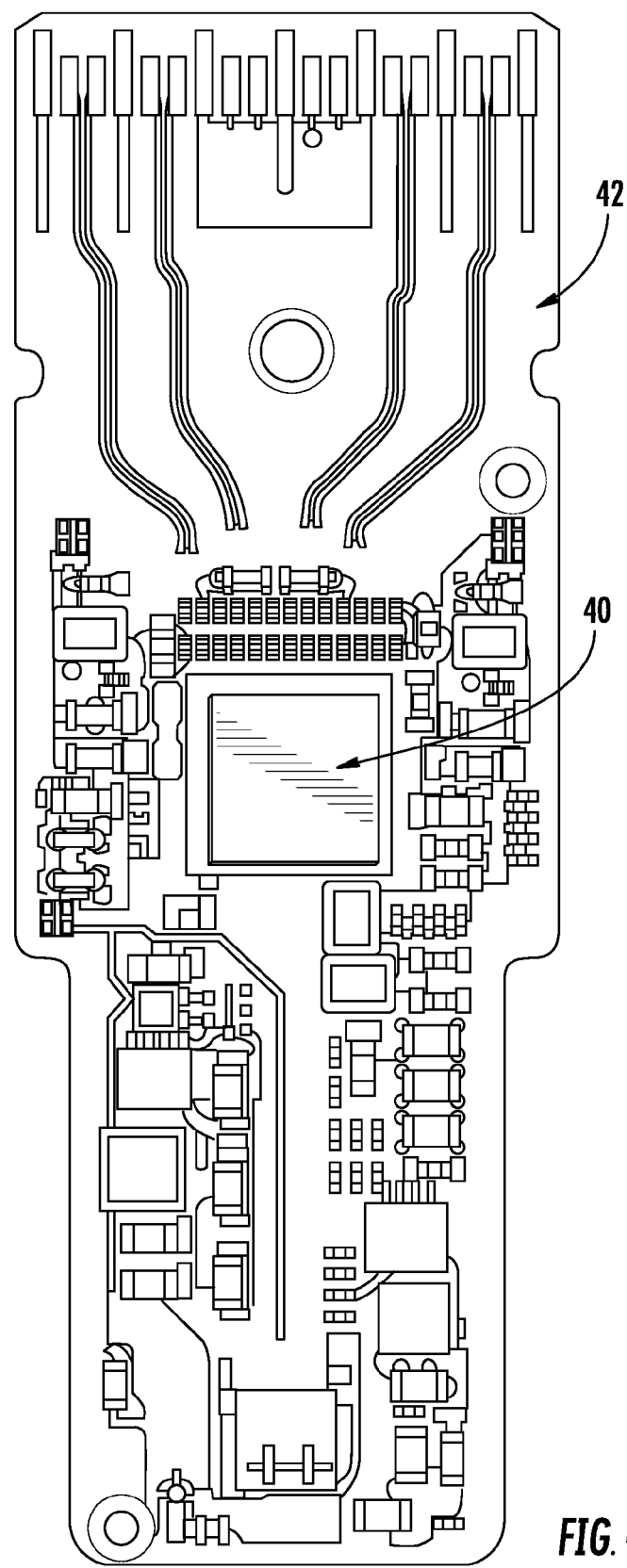
FIG. 4 is a bottom view of a printed circuit board (PCB) assembly of the optoelectronic interface of FIG. 3 prior to mounting a TEC to the optoelectronic transducer according to an example embodiment.
Figure 5:
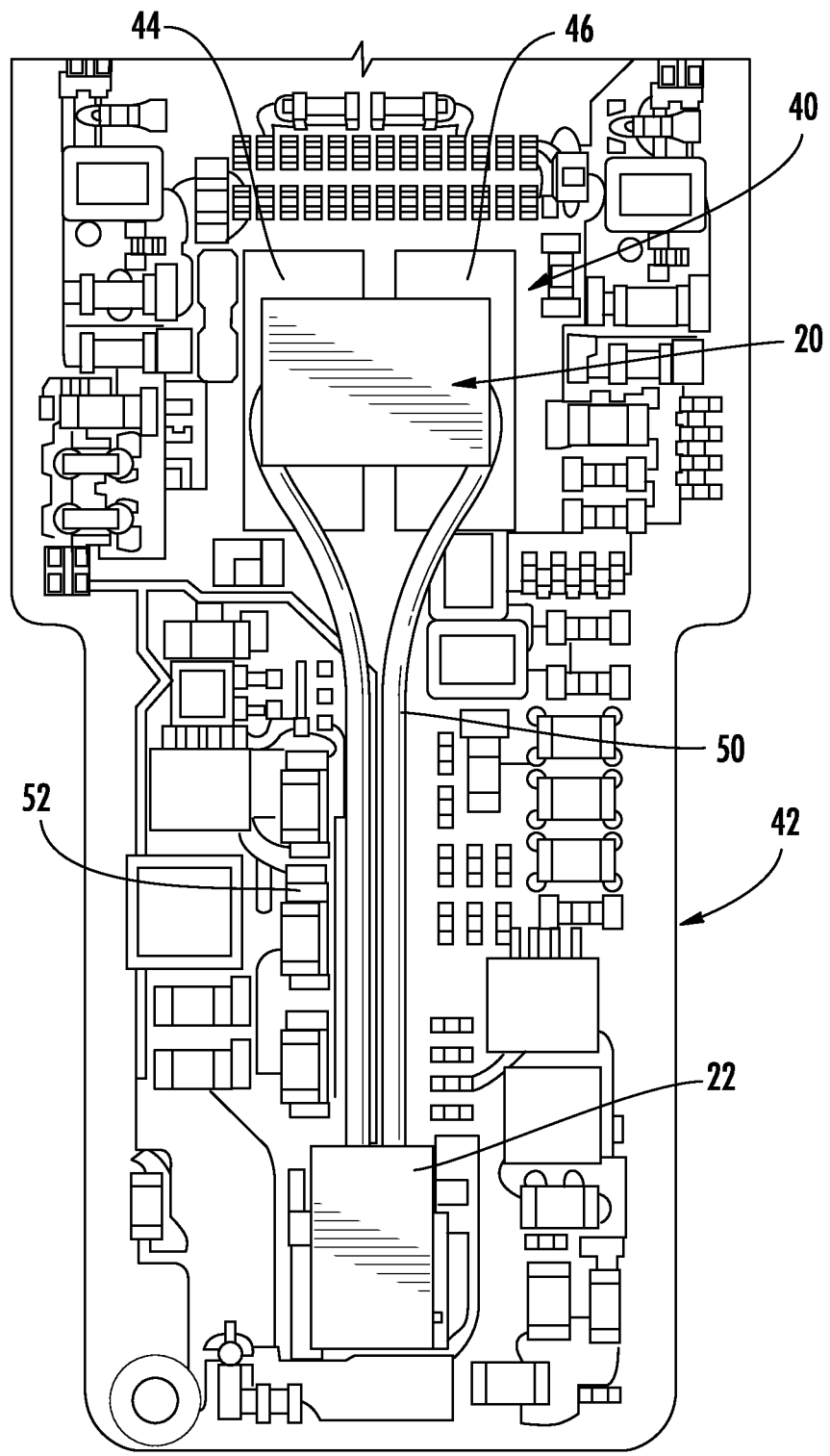
FIG. 5 is a bottom view of the PCB assembly of FIG. 4 after mounting the TEC to the optoelectronic transducer according to an example embodiment.
Figure 6:
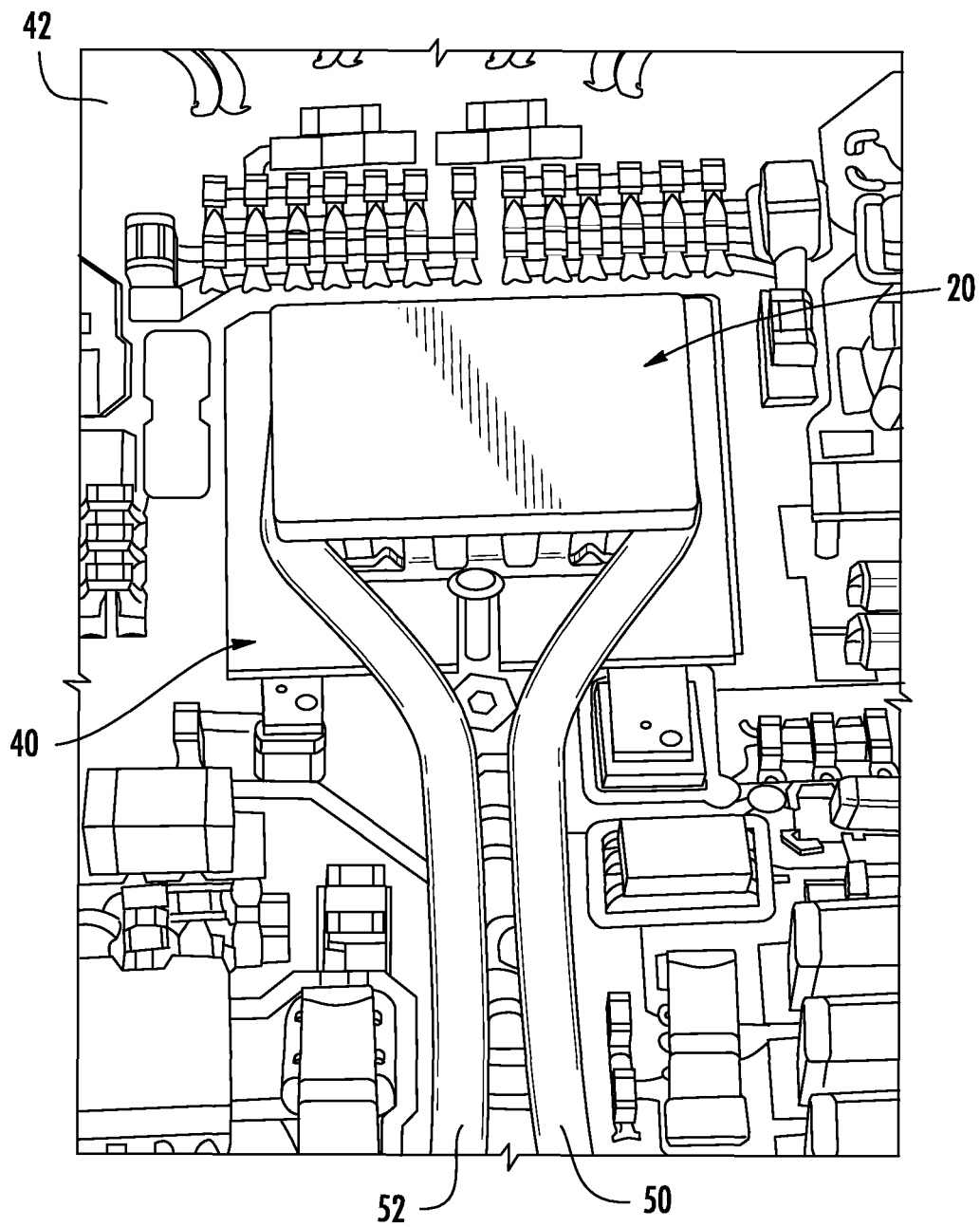
FIG. 6 is a close-up bottom perspective view of the TEC mounted to the optoelectronic transducer of FIG. 5 according to an example embodiment.

With reference now to FIG. 5, according to embodiments of the present invention, a TEC 20 may be secured to the optoelectronic transducer 40, for example, by being directly secured to a surface of the optoelectronic transducer via an epoxy. For example, in embodiments in which the optoelectronic transducer comprises a VCSEL 44 and a PD 46, the TEC 20 may be secured to at least one of a planar surface of the VCSEL or a planar surface of the PD. In FIG. 5, for example, the TEC 20 is secured to a planar surface of both the VCSEL 44 and the PD 46, such as pads connected to thermal diodes of the VCSEL 44 and the PD 46 to enlarge the TEC connectivity area and to maximize the efficiency of the heat transfer. In FIG. 4, one pad for the optoelectronic transducer 40 (e.g., for the VCSEL and the PD) is provided, whereas in FIGS. 5 and 6, an embodiment is depicted in which two pads are provided, respectively, for the VCSEL 44 and the PD 46. For example, the TED 20 may be disposed such that the "cold" side of the TEC is adjacent or in contact with the planar surface of the VCSEL 44 and/or the PD 46, so as to remove heat directly from the optoelectronic transducer. A close-up view of the TEC 20 is provided in FIG. 6, which shows the "hot" side 24b of the TEC disposed away from the optoelectronic transducer 40.

Turning again to FIG. 5, the TEC may be connected to a power source 22 via cables 50, 52. One of the cables 50 may be connected to a positive terminal of the power source 22, while the other cable 52 may be connected to a negative terminal of the power source to allow current to flow through the TEC 20 to create the cooling effect as described above.

Figure 7:
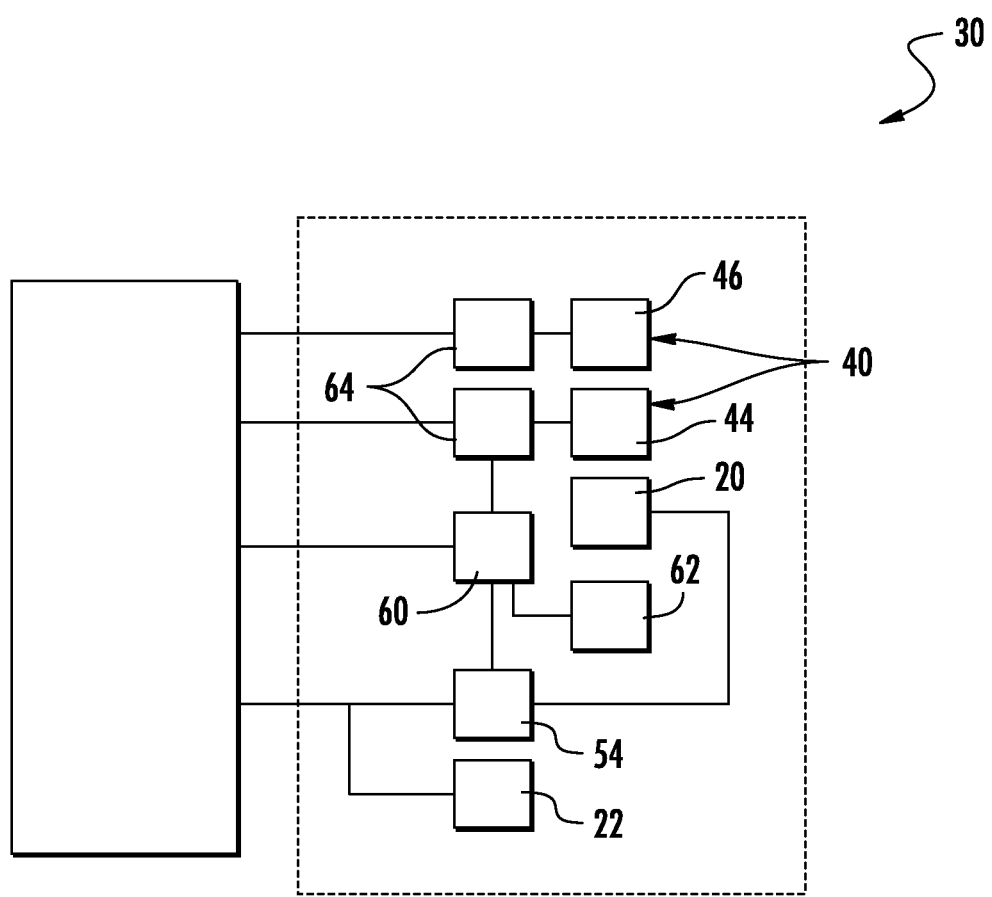
FIG. 7 is a schematic illustration of the electrical connections between components of the optoelectronic interface according to an example embodiment.

With reference now to FIG. 7, the TEC 20 may be electrically connected to a TEC driver 54. The TEC driver 54 may be supported on the PCB assembly 42 (shown in FIGS. 4-6) and may comprise driving circuitry that is configured to activate and deactivate the TEC 20. For example, the TEC driver 54 may be electrically connected to the power source 22 shown in FIG. 5, such that the TEC driver 54 is able to turn on power to the TEC 20 to begin cooling the optoelectronic transducer 40 and to turn off power to the TEC to cease cooling.

In this regard, a microcontroller 60 may be provided that is configured to monitor a temperature of the PCB assembly 42 and to communicate with the TEC driver 54 to selectively activate and deactivate the TEC 20 at least partially based on the monitored temperature so as to regulate a temperature of the optoelectronic transducer 40. In some embodiments, the microcontroller 60 may be configurable (e.g., programmable) by a user to selectively activate and deactivate the TEC 20 to maintain the optoelectronic transducer 40 within a user-defined range of temperatures. Some users, for example, may desire to maintain the optoelectronic transducer 40 within a lower, optimal operating temperature range to extend the life of the optoelectronic transducer 40 as much as possible. For example, with respect to VCSELs, a user may configure the microcontroller 60 to maintain the temperature of the VCSEL at approximately 55° C.-60° C. to achieve an optimal life span. In other cases, however, the user may be more interested in achieving lower operating costs of the datacenter, rather than extending the life of the optoelectronic transducer 40. With respect to VCSELs, for example, in such cases the user may configure the microcontroller 60 to maintain the temperature of the VCSEL at approximately 60° C.-70° C.

Feedback regarding the temperature of the optoelectronic transducer 40 may be received by the microcontroller 60 in various ways to allow a determination to be made as to whether the TEC 20 should be activated (to cool the optoelectronic transducer 40) or deactivated (once the optoelectronic transducer has been cooled to some extent). In some embodiments, for example, the microcontroller 60 may be electrically connected to a thermal sensor 62, as shown in FIG. 7. The microcontroller 60 may be configured to communicate with the thermal sensor 62 to monitor the temperature of the PCB assembly 42. In this regard, the temperature of the PCB assembly 42 may be indicative of the temperature of the optoelectronic transducer 40, as it may not be possible to directly measure the temperature of the optoelectronic transducer (e.g., the PD or the VCSEL).

Moreover, an optoelectronic transducer driver 64 (e.g., a VCSEL driver) may be provided that is supported on the PCB assembly and is electrically connected to the optoelectronic transducer 40 (e.g., the VCSEL). The optoelectronic transducer driver 64 may comprise driving circuitry that is configured to control operation of the optoelectronic transducer 40, such as for directing the emission of light (optical signals) according to the corresponding electrical signals received via the PCB connector port 16 (shown in FIG. 1).

In some embodiments, the optoelectronic transducer driver 64 may be configured to detect a current of the optoelectronic transducer 40. The detected current (e.g., the current detected across a VCSEL) may in turn be communicated to the microcontroller 60, and the microcontroller may be configured to determine a corresponding temperature of the optoelectronic transducer 40 based on the current detected by the optoelectronic transducer driver 64. The microcontroller 60 may in turn be configured to selectively activate and deactivate the TEC 20 at least partially based on the temperature of the optoelectronic transducer (e.g., the temperature of the VCSEL, as determined based on the detected current through the VCSEL).

In still other embodiments, the TEC driver 54 may be configured to receive a voltage drop detected across the TEC 20 and to communicate the detected voltage drop to the microcontroller 60. The microcontroller 60 may, in turn, be configured to communicate with the TEC driver 54 to selectively activate and deactivate the TEC 20 at least partially based on the voltage drop, where the voltage drop is indicative of an amount of heat that is being absorbed from the optoelectronic transducer 40. In addition, in some embodiments, the optoelectronic transducer driver 64 may be configured to measure a voltage drop across the optoelectronic transducer 40. For example, a VCSEL driver may detect the voltage drop across the VCSEL, and/or a PD driver may detect the voltage drop across the PD. The microcontroller 60 may, in turn, receive a readout of that voltage drop and may compare the voltage drop to the feedback from the thermal sensor 62 in a closed loop system. Accordingly, the microcontroller 62 may receive two signals for thermal feedback, e.g., one signal being received from the thermal sensor 62 and one signal being received from the optoelectronic transducer driver 64. The microcontroller 62 may then, using a temperature compensation circuit, close the loop to determine an actual temperature of the optoelectronic transducer 40, and the actual temperature of the optoelectronic transducer 40 that is determined may be used to selectively activate and deactivate the TEC as described above. Moreover, the microcontroller 60 may, in some embodiments, report the voltage and temperature information to other system components, such as to a system host. The microcontroller 60, optoelectronic transducer driver(s) 64, TEC driver 54, and other components may further be connected to an electrical interface connector, such as a quad small form-factor pluggable (QSFP) connector, as shown in FIG. 7.

Accordingly, as described above with reference to FIGS. 1-7, an apparatus is provided that includes a TEC secured to an optoelectronic transducer for removing heat from the optoelectronic transducer in response to instructions from a TEC driver, as well as a microcontroller electrically connected to the TEC driver for monitoring temperature and communicating with the TEC driver to selectively activate and deactivate the TEC at least partially based on the monitored temperature and/or other measured/detected data to effect a more efficient cooling mechanism for optoelectronic transducers, such as VCSELs, to achieve longer life and better performance of the optoelectronic transducer.

In some embodiments, a method of assembling an optoelectronic interface is provided. According to embodiments of the method, an optoelectronic transducer may be mounted onto a PCB assembly, wherein the optoelectronic transducer is configured to convert between optical signals and corresponding electrical signals for respectively transmitting or receiving optical signals through a fiber optic cable. A TEC may be secured to the optoelectronic transducer, where the TEC is configured to remove heat from the optoelectronic transducer, as described above. Furthermore, a TEC driver may be mounted to the PCB assembly and connected to the TEC. The TEC driver may comprise driving circuitry configured to activate and deactivate the TEC. In this regard, a microcontroller may be mounted to the PCB assembly and connected to the TEC driver. The microcontroller may be configured to monitor a temperature of the PCB assembly and to communicate with the TEC driver to selectively activate and deactivate the TEC at least partially based on the monitored temperature so as to regulate a temperature of the optoelectronic transducer.

As noted above, in some embodiments, the optoelectronic transducer may comprise a vertical-cavity surface-emitting laser (VCSEL), and in some embodiments the optoelectronic transducer may comprise a photodetector (PD). In some cases, the optoelectronic transducer may comprise a VCSEL and a PD, and the method may further comprise securing the TEC to at least one of a planar surface of the VCSEL or a planar surface of the PD. The TEC may, for example, be directly secured to the optoelectronic transducer via epoxy.

In some embodiments, the microcontroller may be configurable by a user to selectively activate and deactivate the TEC to maintain the optoelectronic transducer within a user-defined range of temperatures, as described above. Moreover, according to some embodiments of the method, a thermal sensor may be mounted to the PCB assembly and connected to the microcontroller. The microcontroller may be configured to communicate with the thermal sensor to monitor the temperature of the PCB assembly.

According to some embodiments of the method, an optoelectronic transducer driver may be mounted to the PCB assembly. The optoelectronic transducer driver may comprise driving circuitry configured to control operation of the optoelectronic transducer, and the optoelectronic transducer driver may be configured to detect a current of the optoelectronic transducer, as described above. Moreover, the microcontroller may be further configured to determine a temperature of the optoelectronic transducer based on the current detected by the optoelectronic transducer driver, and the microcontroller may be configured to selectively activate and deactivate the TEC at least partially based on the temperature of the optoelectronic transducer. In some embodiments, the TEC driver may be configured to receive a voltage drop detected across the thermoelectric cooler and to communicate the voltage drop to the microcontroller. The microcontroller may be configured to communicate with the TEC driver to selectively activate and deactivate the TEC at least partially based on the voltage drop.

Many modifications and other embodiments of the inventions set forth herein will come to mind to one skilled in the art to which these inventions pertain having the benefit of the teachings presented in the foregoing descriptions and the associated drawings. Although the figures only show certain components of the apparatus and systems described herein, it is understood that various other components (e.g., components that would normally be mounted on the PCB assembly) may also be part of the optoelectronic interface and fiber optic system. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:
1. An apparatus comprising:
a printed circuit board assembly;
an optoelectronic transducer supported on the printed circuit board assembly and configured to convert between optical signals and corresponding electrical signals for respectively transmitting or receiving optical signals through a fiber optic cable;

a thermoelectric cooler secured to the optoelectronic transducer and configured to remove heat from the optoelectronic transducer;

a thermoelectric cooler driver supported on the printed circuit board assembly and comprising driving circuitry configured to activate and deactivate the thermoelectric cooler; and a microcontroller configured to monitor a temperature of the printed circuit board assembly and to communicate with the thermoelectric cooler driver to selectively activate and deactivate the thermoelectric cooler at least partially based on the monitored temperature so as to regulate a temperature of the optoelectronic transducer.

2. The apparatus of claim 1, wherein the optoelectronic transducer comprises a vertical-cavity surface-emitting laser (VCSEL).

3. The apparatus of claim 1, wherein the optoelectronic transducer comprises a photodetector (PD).

4. The apparatus of claim 1, wherein the optoelectronic transducer comprises a VCSEL and a PD, and wherein the thermoelectric cooler is secured to at least one of a planar surface of the VCSEL or a planar surface of the PD.

5. The apparatus of claim 1, wherein the thermoelectric cooler is directly secured to the optoelectronic transducer via epoxy.

6. The apparatus of claim 1, wherein the microcontroller is configurable by a user to selectively activate and deactivate the thermoelectric cooler to maintain the optoelectronic transducer within a user-defined range of temperatures.

7. The apparatus of claim 1 further comprising a thermal sensor, wherein the microcontroller is configured to communicate with the thermal sensor to monitor the temperature of the printed circuit board assembly.

8. The apparatus of claim 1 further comprising an optoelectronic transducer driver supported on the printed circuit board assembly, wherein the optoelectronic transducer driver comprises driving circuitry configured to control operation of the optoelectronic transducer, wherein the optoelectronic transducer driver is configured to detect a current of the optoelectronic transducer.

9. The apparatus of claim 8, wherein the microcontroller is further configured to determine a temperature of the optoelectronic transducer based on the current detected by the optoelectronic transducer driver, wherein the microcontroller is configured to selectively activate and deactivate the thermoelectric cooler at least partially based on the temperature of the optoelectronic transducer.

10. The apparatus of claim 1, wherein the thermoelectric cooler driver is configured to receive a voltage drop detected across the thermoelectric cooler and to communicate the detected voltage drop to the microcontroller, wherein the microcontroller is configured to communicate with the thermoelectric cooler driver to selectively activate and deactivate the thermoelectric cooler at least partially based on the voltage drop.

11. A method of assembling an optoelectronic interface comprising:

mounting an optoelectronic transducer onto a printed circuit board assembly, wherein the optoelectronic transducer is configured to convert between optical signals and corresponding electrical signals for respectively transmitting or receiving optical signals through a fiber optic cable;

securing a thermoelectric cooler to the optoelectronic transducer, wherein the thermoelectric cooler is configured to remove heat from the optoelectronic transducer;

mounting a thermoelectric cooler driver to the printed circuit board assembly and connecting the thermoelectric cooler driver to the thermoelectric cooler, wherein the thermoelectric cooler driver comprises driving circuitry configured to activate and deactivate the thermoelectric cooler; and mounting a microcontroller to the printed circuit board assembly and connecting the microcontroller to the thermoelectric cooler driver, wherein the microcontroller is configured to monitor a temperature of the printed circuit board assembly and to communicate with the thermoelectric cooler driver to selectively activate and deactivate the thermoelectric cooler at least partially based on the monitored temperature so as to regulate a temperature of the optoelectronic transducer.

12. The method of claim 11, wherein the optoelectronic transducer comprises a vertical-cavity surface-emitting laser (VCSEL).

13. The method of claim 11, wherein the optoelectronic transducer comprises a photodetector (PD).

14. The method of claim 11, wherein the optoelectronic transducer comprises a VCSEL and a PD, the method further comprising securing the thermoelectric cooler to at least one of a planar surface of the VCSEL or a planar surface of the PD.

15. The method of claim 11, wherein the thermoelectric cooler is directly secured to the optoelectronic transducer via epoxy.

16. The method of claim 11, wherein the microcontroller is configurable by a user to selectively activate and deactivate the thermoelectric cooler to maintain the optoelectronic transducer within a user-defined range of temperatures.

17. The method of claim 11 further comprising mounting a thermal sensor to the printed circuit board assembly and connecting the thermal sensor to the microcontroller, wherein the microcontroller is configured to communicate with the thermal sensor to monitor the temperature of the printed circuit board assembly.

18. The method of claim 11 further comprising mounting an optoelectronic transducer driver to the printed circuit board assembly, wherein the optoelectronic transducer driver comprises driving circuitry configured to control operation of the optoelectronic transducer, wherein the optoelectronic transducer driver is configured to detect a current of the optoelectronic transducer.

19. The method of claim 18, wherein the microcontroller is further configured to determine a temperature of the optoelectronic transducer based on the current detected by the optoelectronic transducer driver, wherein the microcontroller is configured to selectively activate and deactivate the thermoelectric cooler at least partially based on the temperature of the optoelectronic transducer.

20. The method of claim 11, wherein the thermoelectric cooler driver is configured to receive a voltage drop detected across the thermoelectric cooler and to communicate the voltage drop to the microcontroller, wherein the microcontroller is configured to communicate with the thermoelectric cooler driver to selectively activate and deactivate the thermoelectric cooler at least partially based on the voltage drop.

* * * * *